United States Patent

Wei

(10) Patent No.: US 6,556,443 B1
(45) Date of Patent: Apr. 29, 2003

(54) HEAT DISSIPATION DEVICE COUPLING STRUCTURE

(76) Inventor: Wen Chen Wei, P.O. Box No. 6-57, Chung-Ho City, Taipei Hsien 235 (TW)

( * ) Notice: Subject to any disclaimer, the term of this patent is extended or adjusted under 35 U.S.C. 154(b) by 0 days.

(21) Appl. No.: 09/612,438

(22) Filed: Jul. 7, 2000

(30) Foreign Application Priority Data

Mar. 13, 2000 (TW) ...................................... 89203919 U

(51) Int. Cl.$^7$ ................................................ H05K 7/20
(52) U.S. Cl. ........................ 361/704; 361/700; 361/702; 257/706; 165/80.3
(58) Field of Search ................................ 361/689–690, 361/692, 694, 700–710, 712; 257/706–727, 686, 692; 174/15.1, 15.2, 16.3; 165/80.2, 80.3, 80.4, 185

(56) References Cited

U.S. PATENT DOCUMENTS 6,153,932 A * 11/2000 Liang .......................... 257/712
6,205,026 B1 * 3/2001 Wong et al. ................. 361/704

* cited by examiner

Primary Examiner—Michael Datskovsky

(57) ABSTRACT

A heat dissipation device coupling structure includes of a heat sink and frame-type retaining tabs. The heat sink has a shoulder plate projecting outward from lower base thereof and L-shaped lock tabs are disposed on two ends at the lower extent of the positioner rod which is elevated thereby. A seat section having a stop tab at lower end thereof and tensile clip tabs curving outward from upper end thereof. A lip tab is folded downwardly along the outer rims of a frame plate forming upper and lower containment recesses. When assembling, a central processing unit is first inserted into the lower containment recess such that face plate is secured against the upper end of the frame plate, following which a shoulder plate of the heat sink is inserted into the lower extent of the positioner rod, with the other side of the heat sink held down by clip tabs in the upper containment recess thereby tightly secure the central processing unit. Conversely, disassembly is accomplished by apply a slight force to spread the clip tabs apart.

1 Claim, 6 Drawing Sheets

HEAT DISSIPATION DEVICE COUPLING STRUCTURE

BACKGROUND OF THE INVENTION

1) Field of the Invention

The invention herein relates to a heat dissipation device coupling structure particularly to a heat sink to a computer central processing unit(CPU) consists of unitary upper and lower containment recesses with frame-type retaining tabs and, furthermore, a matching shoulder plate of a heat sink lower base that accommodates the inserting of the central processing unit and the heat sink that can be simply and rapidly assembled and disassembled.

2) Description of the Prior Art

Due to the faster and faster executing speed of computer central processing units (CPU), proportionately greater volumes of heat are generated and, if such heat is not rapidly dispersed, the stability of computer operating system is adversely affected. As a result, heat dissipation devices are typically installed on CPUs such that the heat source of the CPU can be conducted away and dissipated. In a conventional heat dissipation device, as indicated in FIG. 1, a heat sink 10 is positioned by means of mounting pins 12 through mounting holes 21 of a CPU base 20. A retaining clip 30 is secured to the mounting pins 12 enable a bottom plate 11 of the heat sink 10 being tightly coupled to the CPU 22. The conventional retaining structure as shown in FIG. 1, concave positioning notches 31 are formed along with outer rim on two sides of retaining clip 30 that are fitted against the mounting pins 12, which leads to difficulties in quality control of assembly; for example, the structure may dislodge or force apart due to external impact if not being tightly fastened. Another conventional structure available in the market, as shown in FIG. 2, a skirt plate 42 is disposed on the frame 40 for mounting CPU 60, the frame 40 has a pair of fastening mortises 41 formed on each side thereof, with a catch block 411 at lower end of each fastening mortise 41 in order to clip the CPU 60. Whereas heat sink plate 50 with pinch stops 51 are utilized to couple an upper surface of the CPU 60. When assembling, first the heat sink plate 50 and then the frame 40 is inserted over the upper surface of the CPU 60. But the application of force required by the above sandwiched composite structure is less convenient because the fastening mortises 41 are simply formed along two sides, thereby two hands of the user must be utilized forcefully during assembly. Also the user's thumb and index finger must be used during disassembly to disengage the catch blocks 411 thereby an injudicious application of force may result in sudden tensile release of the heat sink plate 50 and thus causing possible injury so as to impact other computer components.

In view of the various drawbacks of the conventional heat dissipation coupling structures, the inventor has developed the heat dissipation device coupling structure of the invention herein that only requires spreading the clip tabs apart using minimal force to achieve the objective of tightly assembling the heat dissipation device as well as rapid disassembly thereof.

SUMMARY OF THE INVENTION

The primary objective of the invention herein is to provide a heat dissipation device coupling structure which is comprised of a heat sink and frame-type retaining tabs. The heat sink has a shoulder plate projecting outward from lower base thereof, and the length of the shoulder plate is smaller than a positioner rod such that the shoulder plate can be inserted to the lower end of the positioner rod which is disposed on one side of the frame-type retaining tabs. Moreover, L-shape lock tabs are disposed on each of the two ends at the lower extent of the positioner rod which is elevated thereby, with a seat section having a stop tab at lower end thereof and tensile clip tabs curving outward from upper end thereof. A frame plate is situated along each of two other opposite sides such that an opening formed by two frame plates correspond to each end of the positioner rod is narrower than a wider opening formed by two lock tabs. Furthermore, a lip tab is folded downwardly along the outer rim of the frame plate forming upper and lower containment recesses, wherein the lower containment recess accommodating and positioning the central processing unit and also inserting the heat sink shoulder plate into the space formed by the elevation of the positioner rod, thereby enabling the other end of the heat sink to be pressed downwardly by tensile clip tabs into the upper containment recess. When assembling, the central processing unit is first pressed from outside into the opening under the positioner rod in the lower containment recess, enabling a face plate to be situated at the upper end of the frame plate, the shoulder plate of the heat sink is then engaged from inside out onto the lower extent of the positioner rod. Finally, the other end of the heat sink is pressed downwardly by pushing the clip tabs into engagement in the upper containment recess and, at the same time, the central processing unit is firmly secured under tension and prevented from dislodging. By providing such a structure, the heat sink and the central processing unit can be tightly coupled together easily and rapidly; conversely, disassembly is simple and accomplished by exerting a slight force to spread the clip tabs apart.

In achieving the said objectives of the invention herein, the technological means and overall structural innovations are disclosed to demonstrate the most feasible embodiments and, furthermore, the brief description of the drawings below and the following detailed description of the invention will enable a further understanding of the present invention.

DETAILED DESCRIPTION OF THE INVENTION

Figure 1:
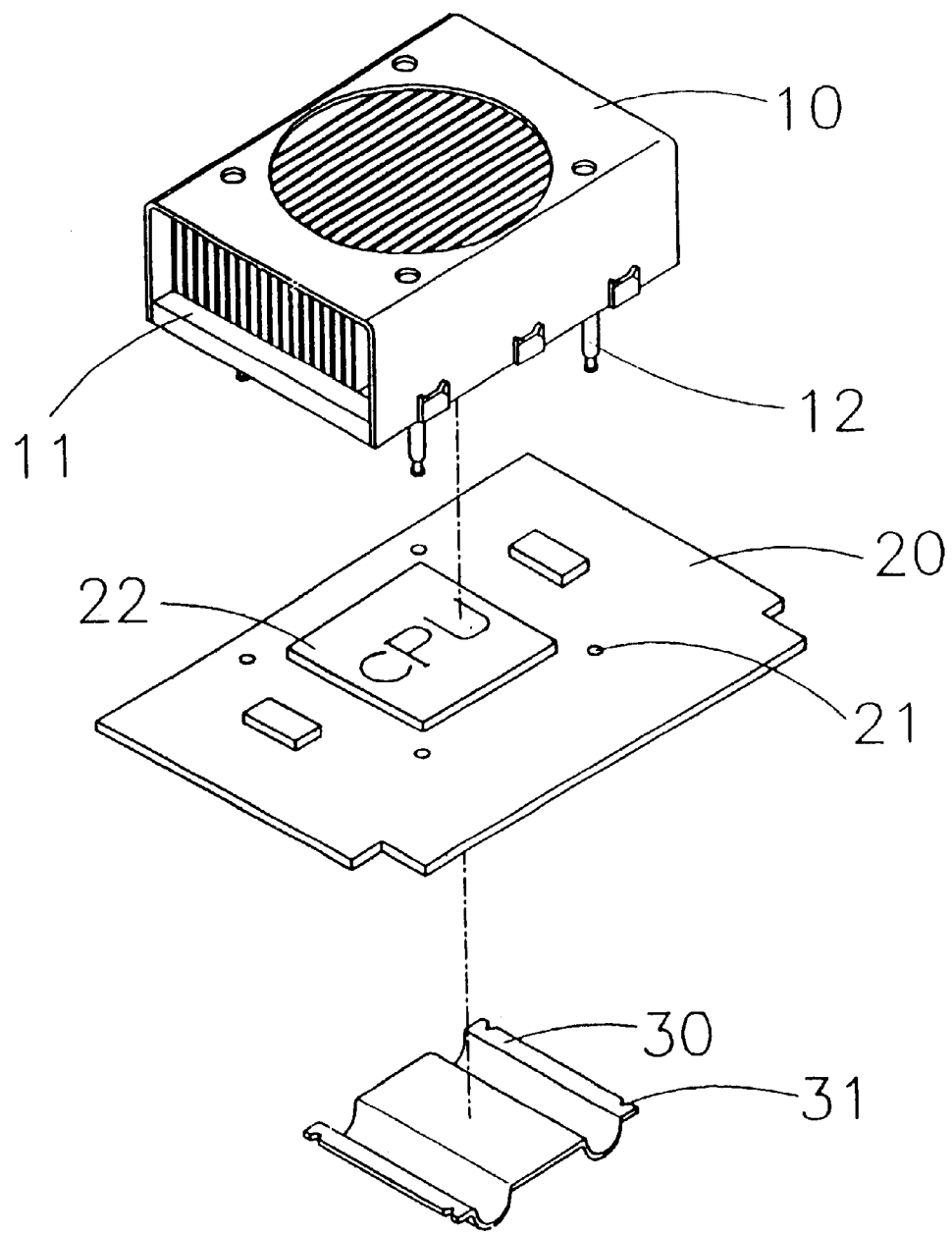
FIG. 1 is an exploded drawing of a conventional heat dissipation device.
Figure 2:
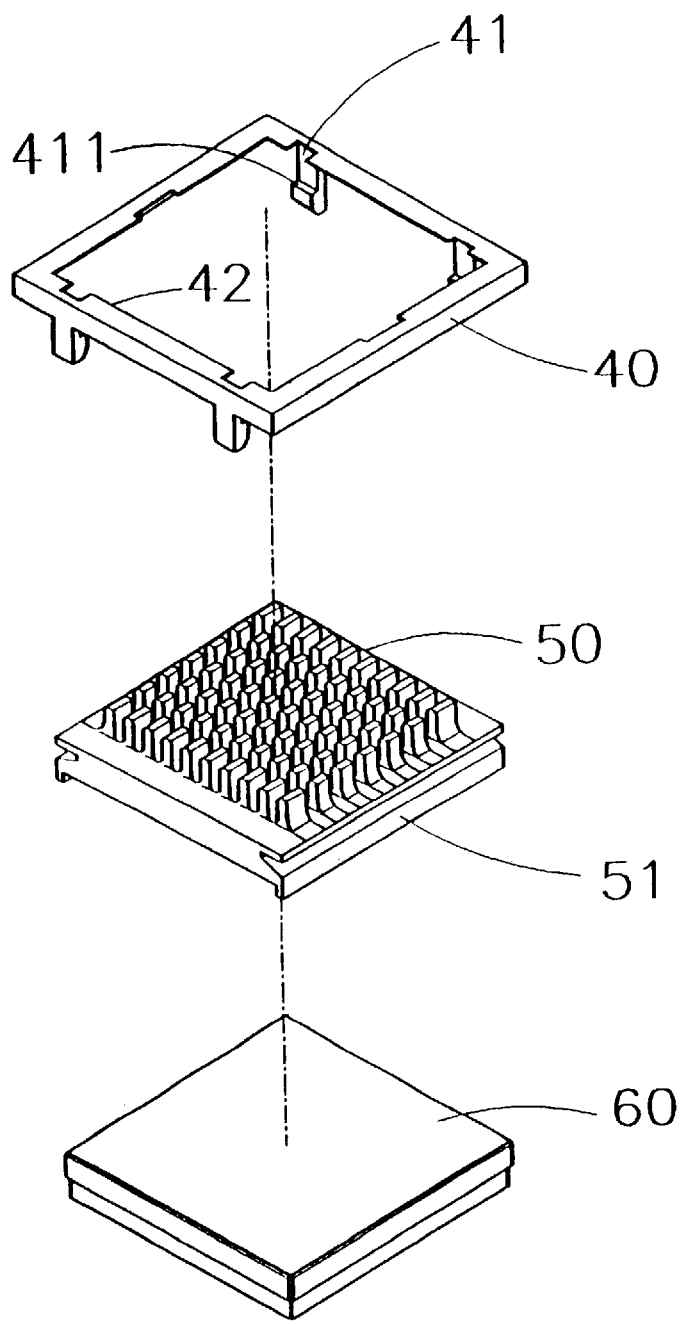
FIG. 2 is an exploded drawing of another conventional heat dissipation device.
Figure 3:
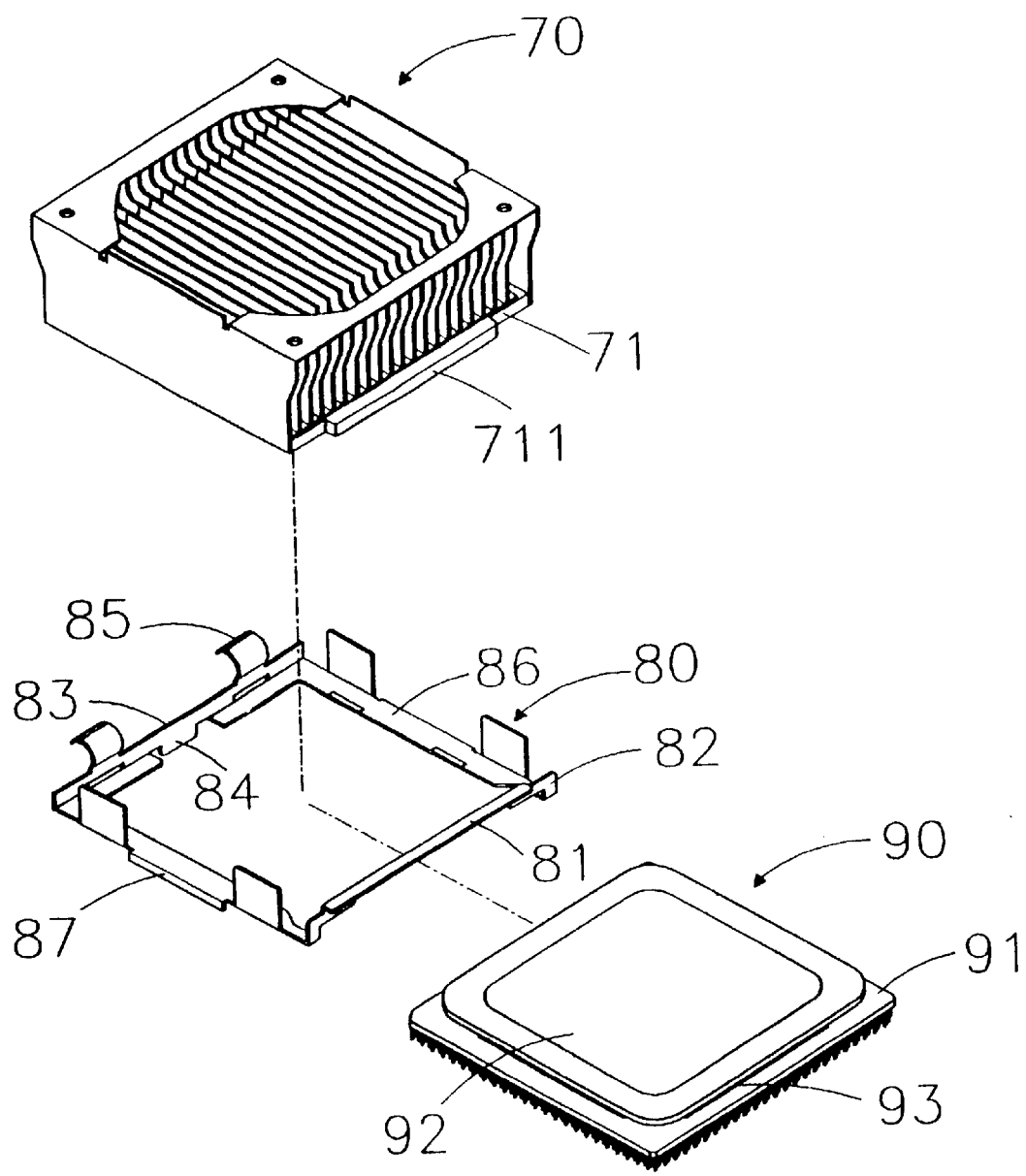
FIG. 3 is an exploded drawing of the invention herein.

Referring to FIG. 3, the invention herein consists of a heat sink 70 having a shoulder plate 711 projecting outward from a lower base 71, wherein the length of the shoulder plate 711 is smaller than a positioner rod 81 such that can be inserted into the lower end of the positioner rod 81 which is disposed on one side of frame-type retaining tabs 80. Furthermore, L-shaped lock tabs 82 are disposed on each of the two ends at lower extent of the positioner rod 81 which is elevated thereby and is situated at opposite side of a seat section 83. The seat section 83 having a stop tab 84 at lower end thereof and tensile clip tabs 85 curving outward from upper end thereof. Each of frame plate 86 is situated at two other opposite sides thereof such that an opening formed by two frame plates 86 correspond to each end of the positioner rod 81 is narrower than a wider opening formed by two lock tabs 82 allowing a central processing unit 90 to be inserted. Furthermore, a lip tab 87 is folded downwardly along the outer rims of the frame plates 86 forming upper and lower containment recesses that enables both the central processing unit 90 and the heat sink 70 to be mounted respectively, wherein the lower containment recess is capable of ensconcing the central processing unit 90 and due to a space formed by elevation of the positioner rod 81 accommodating an insertion of the shoulder plate 711, such that the other end of the heat sink 70 is held down by the clip tabs 85 in a state of fixed insertion in the upper containment recess.

Figure 4:
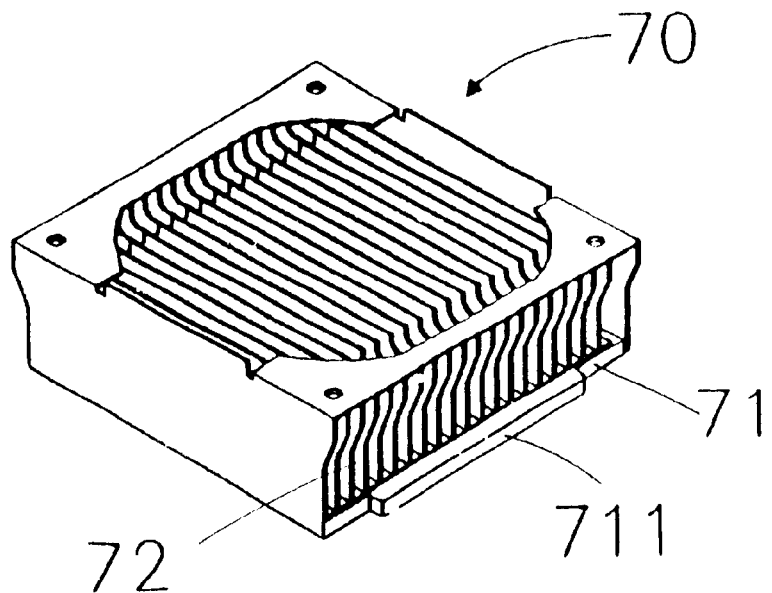
FIG. 4 is an exploded drawing of the invention herein.
Figure 4:
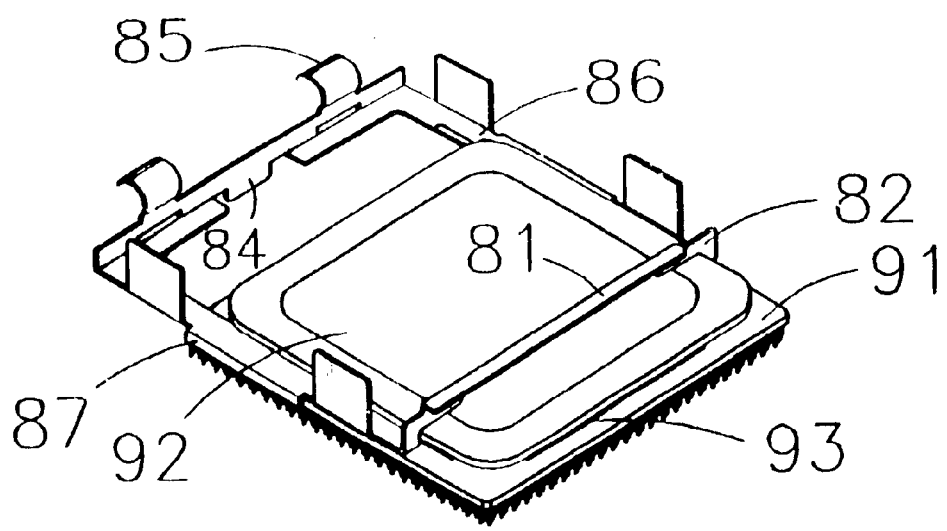
Figure 5:
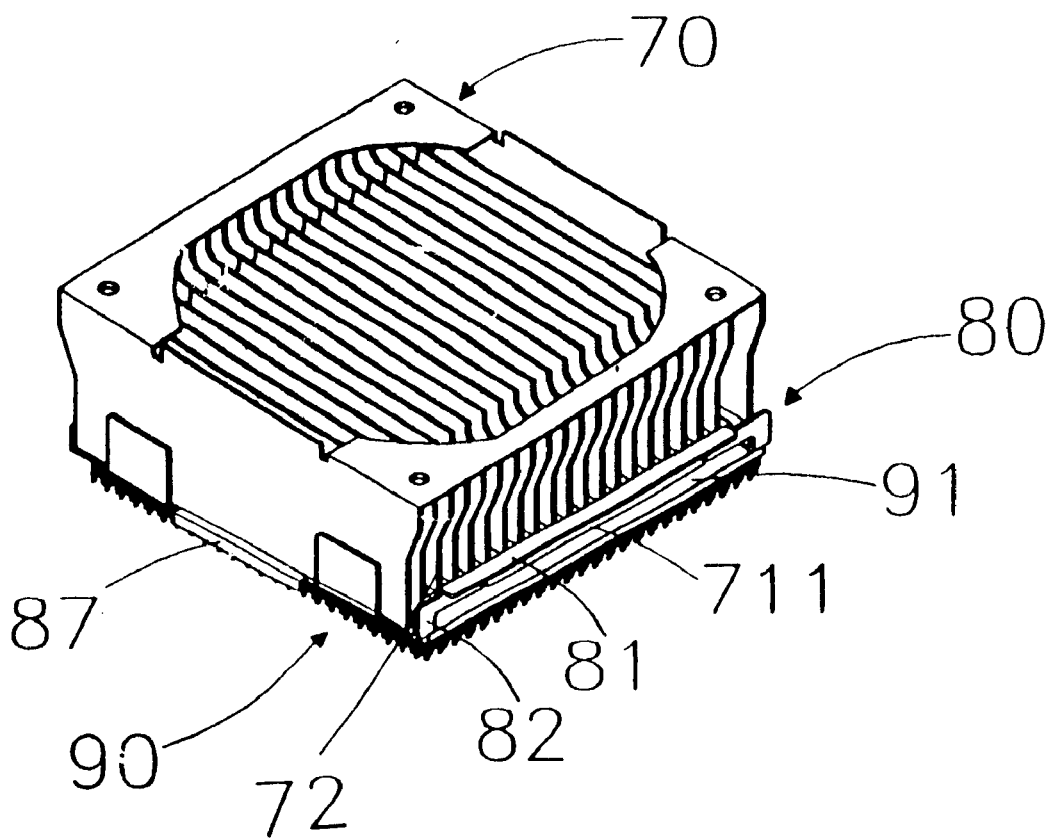
FIG. 5 is an isometric drawing of the invention herein.
Figure 6:
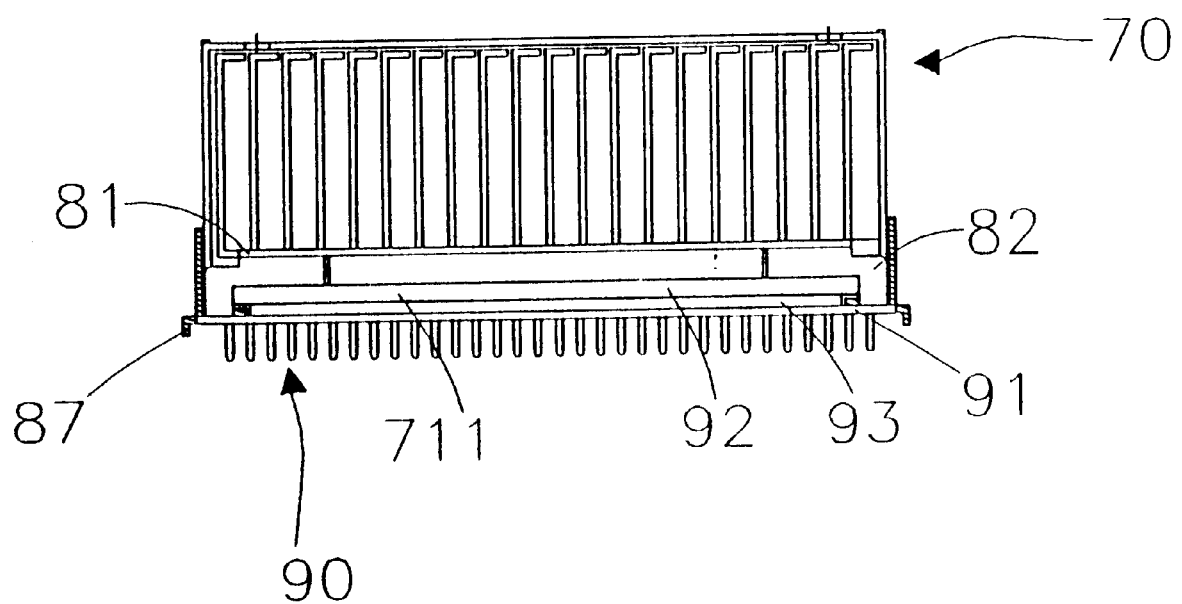
FIG. 6 is an orthographic drawing of the invention herein.

Referring to FIG. 4, FIG. 5, and FIG. 6, when assembling, a slide slot 93 which is a gap formed between a base plate 91 and a face plate 92 of the central processing unit 90. An end surface of the frame plate 86 with frame-type retaining tabs 80 perform as a slip shaft that guides the central processing unit 90 from the exterior of the lower containment recess inserting into the opening at the lower extent of the positioner rod 81 until the base plate 91 is positioned against the stop tab 84. With leftward and rightward movement prevented by restraining of the lip tabs 87 along two sides thereof, enabling the face plate 92 to be retained along edges of the frame plate 86 and secured onto upper side of the frame plate 86. The angled shoulder plate 72 of the heat sink 70 is inserted from outside into the lower extent of the positioner rod 81, such that the L-shaped lock tabs 82 engaged at two ends of the shoulder plate 72. Whereas the heat sink 70 is pressured downwardly against the clip tabs 85 and due to the application of force thereof, the clip tabs 85 move outwardly and return to original position when the heat sink 70 being inserted into the upper containment recess becoming secured against the lower base 71 of the heat sink 70. The entire surface of the lower base 71 covers the face plate 92 and, furthermore, the central processing unit 90 is firmly secured and, after the clip tabs 85 retaining against the heat sink 70 and the L-shaped lock tabs 82 at the same time engaging the lower base 71, which enables coupling and prevents dislodging in that the central processing unit 90 and the heat sink 70 are tightly assembled together, as indicated in FIG. 5. When disassembling, it is only necessary to reverse the foregoing procedure by first spreading the clip tabs 85 apart using minimal force to release the lower base 71 of the heat sink 70.

It is of course to be understood that the embodiment described herein is merely illustrative of the principles of the invention and that a wide variety of modifications thereto may be effected by persons skilled in the art without departing from the spirit and scope of the invention as set forth in the following claims.

What is claimed is:

1. A heat dissipation device coupling structure comprised of a heat sink and frame-type retaining tabs, characterized in that:

the heat sink has a shoulder plate projecting outward from the lower base thereof, with the length of the shoulder plate being smaller than a positioner rod;

the positioner rod is disposed on one side of the frame-type retaining tabs and L-shaped lock tabs are disposed on each two ends at the lower extent of the positioner rod which is elevated thereby forming a space accommodating the insertion of the shoulder plate of the heat sink; a seat section is situated at the opposite side of the positioner rod, having a stop tab at lower end thereof and tensile clip tabs curving outward from upper end thereof; a frame plate is situated at each of two other opposite sides thereof such that an opening formed by each of the frame plate corresponds to each end of the positioner rod is narrower than a wider opening formed by the L-shaped lock tabs and, furthermore, a lip tab is folded downwardly along the outer rims of the frame plate forming upper and lower containment recesses that enables a central processing unit and the heat sink inserting into the upper containment recess and the lower containment recess respectively; by providing such a structure, the heat sink and the central processing unit can be tightly assembled together easily and rapidly; conversely, disassembly is simple and accomplished by applying a slight force to spread the said clip tabs apart.

\* \* \* \* \*